United States Patent
Maaninen et al.

(10) Patent No.: US 9,631,106 B2
(45) Date of Patent: Apr. 25, 2017

(54) CONDUCTIVE INK AND CONDUCTOR

(71) Applicant: TEKNOLOGIAN TUTKIMUSKESKUS VTT, Espoo (FI)

(72) Inventors: Tiina Maaninen, Oulu (FI); Arto Maaninen, Oulu (FI); Markus Tuomikoski, Kempele (FI)

(73) Assignee: TEKNOLOGIAN TUTKIMUSKESKUS VTT, Espoo (FI)

( * ) Notice: Subject to any disclaimer, the term of this patent is extended or adjusted under 35 U.S.C. 154(b) by 174 days.

(21) Appl. No.: 14/268,760

(22) Filed: May 2, 2014

(65) Prior Publication Data

US 2014/0242266 A1  Aug. 28, 2014

Related U.S. Application Data

(62) Division of application No. 12/598,571, filed as application No. PCT/FI2008/050235 on Apr. 29, 2008, now Pat. No. 8,753,544.

(30) Foreign Application Priority Data

May 3, 2007   (EP) .................................... 07107393

(51) Int. Cl.
| | | |
|---|---|---|
| *H01B 1/22* | (2006.01) | |
| *C09D 11/52* | (2014.01) | |
| *B41M 3/00* | (2006.01) | |
| *H05K 1/09* | (2006.01) | |
| *C23C 30/00* | (2006.01) | |

(52) U.S. Cl.
CPC ............. *C09D 11/52* (2013.01); *B41M 3/006* (2013.01); *C23C 30/00* (2013.01); *H05K 1/095* (2013.01); *H01L 2924/0002* (2013.01)

(58) Field of Classification Search
CPC ........................................................ H01M 4/38
USPC .......... 252/500, 513; 106/31.32; 257/13, 40; 429/218.1, 229

See application file for complete search history.

(56) References Cited

U.S. PATENT DOCUMENTS

| | | |
|---|---|---|
| 5,122,375 A | 6/1992 | Sklarchuck et al. |
| 5,399,432 A | 3/1995 | Schleifstein et al. |
| 6,781,305 B1 | 8/2004 | Fujii |
| 2003/0145680 A1 | 8/2003 | Uchida |
| 2005/0173680 A1 | 8/2005 | Yang |
| 2005/0239917 A1 | 10/2005 | Nelson et al. |

(Continued)

FOREIGN PATENT DOCUMENTS

| | | |
|---|---|---|
| CN | 1728288 A | 2/2006 |
| EP | 0 880 307 A2 | 11/1998 |

(Continued)

OTHER PUBLICATIONS

European Search Report issued Sep. 26, 2007, in European Patent Application No. 07 10 7393.

(Continued)

*Primary Examiner* — Khanh Tuan Nguyen
(74) *Attorney, Agent, or Firm* — Birch, Stewart, Kolasch & Birch, LLP

(57) ABSTRACT

Ink is manufactured by mixing unoxidized metallic particles to a binder. The ink is printed on an object and hardened for forming a conductor. The process is performed in an inert atmosphere or in vacuum for maintaining the electrical conductivity of the conductor.

8 Claims, 3 Drawing Sheets

(56) References Cited

U.S. PATENT DOCUMENTS

| | | |
|---|---|---|
| 2006/0021465 A1 | 2/2006 | Uchida |
| 2006/0040182 A1 | 2/2006 | Kawakami et al. |
| 2007/0003742 A1 | 1/2007 | Grandhee et al. |
| 2007/0120119 A1 | 5/2007 | Asabe |
| 2008/0116424 A1 | 5/2008 | Bandyopadhyay et al. |

FOREIGN PATENT DOCUMENTS

| | | |
|---|---|---|
| EP | 1 564 265 A1 | 8/2005 |
| EP | 1 622 170 A1 | 2/2006 |
| JP | 5-159882 A | 6/1993 |
| JP | 9-232079 A | 9/1997 |
| JP | 10-182191 A | 7/1998 |
| JP | 10-188680 A | 7/1998 |
| JP | 2001-230084 A | 8/2001 |
| JP | 2004-158397 A | 6/2004 |
| JP | 2005-229109 A | 8/2005 |
| JP | 2006-49147 A | 2/2006 |
| JP | 2006-63441 A | 3/2006 |
| JP | 2006-193663 A | 7/2006 |
| JP | 2006-278744 A | 10/2006 |
| JP | 2007-99765 A | 4/2007 |
| JP | 2008-543659 A | 12/2008 |
| WO | WO 2008/135632 A1 | 11/2008 |

OTHER PUBLICATIONS

H. Perthuis et al., "Na+ and Li+ NASICON Superionic Conductors Thick Films," Japanese Journal of Applied Physics, vol. 23, No. 5, May 1984, pp. 534-543.

Japanese Office Action for Application No. 2010-504777 dated Jul. 2, 2013 with English Translation.

Office Action issued Nov. 17, 2011, in Chinese Patent Application No. 200880017904.8, with English translation.

| | |
|---|---|
| 100 | ELECTRODE |
| 102 | ACTIVE LAYER |
| 104 | ELECTRODE |
FIG.1
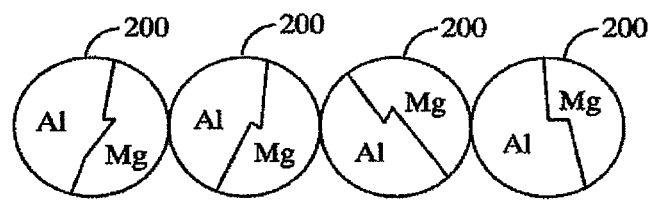
FIG.2
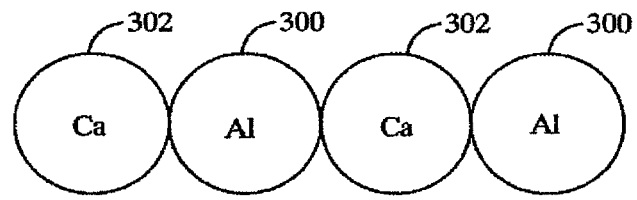
FIG.3

CONDUCTIVE INK AND CONDUCTOR

CROSS-REFERENCE TO RELATED APPLICATIONS

The present application is a 37 C.F.R. §1.53(b) divisional of, and claims priority to, U.S. application Ser. No. 12/598,571, filed Nov. 30, 2009, now U.S. Pat. No. 8,753,544. application Ser. No. 12/598,571 is the national phase under 35 U.S.C. §371 of International Application No. PCT/FI2008/050235, filed on Apr. 29, 2008. Priority is also claimed to European Application No. 07107393.6 filed on May 3, 2007. The entire contents of each of these applications is hereby incorporated by reference.

FIELD

The invention relates to conductive ink, a conductor and methods of manufacturing them.

BACKGROUND

In electronics there are numerous methods to make conductors. A conductor can be printed on a substrate using an electrically conductive ink and curing the ink at room temperature or in an oven at about, for example, 150° C. which enables a high speed fabrication. The ink is usually made by adding silver powder to a mixture of a binder and a solvent. Other metals such as copper and gold can also be used. When the solvent is vaporized during curing the ink to an actual conductor, the silver particles can be considered to form a physical contact to each other resulting in a good conductivity in the conductor.

Although silver and other metals used have good conductivities, their work function is high. The work function for the used metals is about 4.5 eV with only a small variation. The work function means the energy that is needed to free an electron from a solid material. The high work function, which is in practice constant among used metals, results in a low performance and efficiency. That can be seen as a high operational voltage and in a high energy consumption in an electronic device having operational voltage fed through conductors of these materials. However, since a large number of electronic devices have batteries as their energy sources and the electronic devices have increasing number of energy consuming applications, the efficiency and performance should constantly be improved. Hence, for example, there is a need for making the operational voltage lower in order to decrease the energy consumption and increase the period between recharging.

BRIEF DESCRIPTION OF THE INVENTION

An object of the invention is to provide an improved solution. According to an aspect of the invention, there is provided ink for forming a conductor, the ink comprising metallic particles and a binder. The metallic particles comprise at least one of the following: alkaline earth metal, alkali metal excluding radioactive metals and beryllium; and the metallic particles are unoxidized.

According to another aspect of the invention, there is provided a conductor formed using ink comprising metallic particles and a binder. The metallic particles comprise at least one of the following: alkaline earth metal, alkali metal excluding radioactive metals and beryllium; and the metallic particles are unoxidized.

According to another aspect of the invention, there is provided an electrode formed using ink comprising metallic particles and a binder. The metallic particles of the electrode comprise at least one of the following: alkaline earth metal, alkali metal excluding radioactive metals and beryllium; and the metallic particles are unoxidized.

According to another aspect of the invention, there is provided a method of producing ink for forming a conductor, the ink comprising metallic particles. The method comprises mixing unoxidized metallic particles to a binder in an inert atmosphere for forming ink, the metallic particles comprising at least one of the following: alkaline earth metal, alkali metal excluding radioactive metals and beryllium.

The invention provides several advantages. The solution enables printing a conductor using an ink including alkaline earth metal and/or alkali metal. The use of alkaline earth metal and/or alkali metal lowers the work function and makes it possible to control and, if necessary, to decrease the operational voltage and energy consumption.

LIST OF DRAWINGS

In the following, the invention will be described in greater detail with reference to the embodiments and the accompanying drawings, in which FIG. 1 shows an electronic component;

FIG. 2 shows a mixture of metal particles milled together,

FIG. 3 shows a mixture of metal particles milled separately and mixed afterwards.

DESCRIPTION OF EMBODIMENTS

Figure 4:
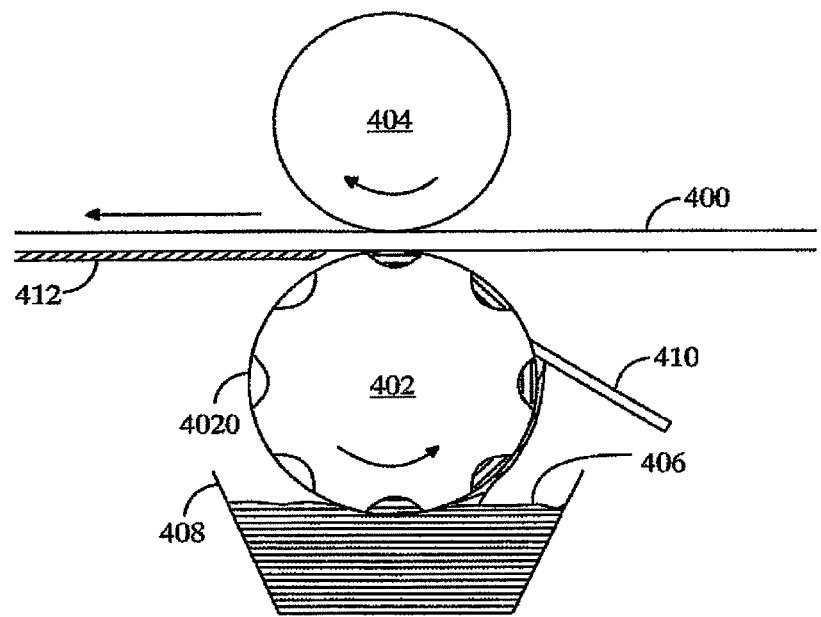
FIG. 4 shows a gravure printing method.

With reference to FIG. 1, examine an example of an electronic component. The component may be an optoelectronic component such as an OLED component (Organic Light-Emitting Device), OSC (Organic Solar Cell), OFET (Organic Field Effect Transistor) or the like. In general however, the component may be any electrical component which can be considered to comprise operational parts between electrodes, for example such as an antenna. In this example, the component may comprise a first electrode 100, at least one active layer 102 and a second electrode 104. The electrodes 100, 104 are conductors which provide the active layer 102 of the component with electric energy for a proper operation. In the active layer 102 of an OLED component, recombination of electrons and holes, which are charge carriers of the electric current, may take place and the recombination may release energy in the form of optical radiation in this example.

At least one of the electrodes 100, 104 of the component can be printed using a suitable ink. The ink may be prepared using a metallic material which comprises alkaline earth metal, alkali metal or both alkaline earth metal and alkali metal. The useful alkaline earth metals are magnesium (Mg), calcium (Ca), strontium (Sr) and barium (Ba). Beryllium (Be) can be excluded. The alkali metals are lithium (Li), sodium (Na), potassium (K), rubidium (Rb) and cesium (Cs). The radioactive materials radium (Ra) and francium (Fr) cannot in practice be used. The metallic material may additionally include at least one metal from groups 3 to 15 of the periodic table of the elements. As an example of these metals, aluminum (Al) may be mixed with, for example, magnesium or calcium.

The work functions of these metals or the combination of the metals can be made low enabling a component to have a high performance and efficiency. Here is a list of work functions: magnesium 3.7 eV, calcium 2.9 eV, strontium 2.6 eV, barium 2.5 eV, lithium 2.9 eV, sodium 2.4 eV, potassium 2.3 eV, rubidium 2.3 eV and cesium 2.0 eV (the values here are based on CRC handbook of chemistry and physics). Although aluminum has a high work function (4.2 eV), a proper mixture of aluminum with at least one metal of a low work function results in a low work function. A low work function means less than about 4 eV in this application. During manufacturing, the work function of the conductor can be controlled by mixing the metallic materials suitably. Hence, if a certain work function is desirable, the metallic materials can be mixed such that the target can be achieved. A suitable mixture can be found, for example, experimentally. In a ready-made conductor the amount of alkaline earth metal and/or alkali metal determines the work function.

The metallic material may be milled with at least one process control agent in an inert atmosphere or in vacuum. An inert material does not react chemically. The metallic particles may also be proper as such without milling.

The metallic material may be a metallic powder comprising metallic particles. The size, such as a diameter, of the metallic particles may be around tens of micrometers. However, the metallic particles may be larger or smaller, too. The metallic particles may have an electrically isolating surface due to, for example, oxidation. Typically, metals of low work function oxidize easily. During milling the isolating surface can be removed and a conductive surface may be formed to the metallic particles. The conductive surface remains conductive because the milling is performed in an inert atmosphere or vacuum and the inert atmosphere or the vacuum prevents re-oxidation. The milling may change the shape of the particles and decrease the size of the particles such that the size of the milled particles may be around 5 micrometers although the particles may be larger or smaller, too. Both the shape and the size have an effect on the quality of ink.

The milling process may be performed without a process control agent. However, it is common that one or more process control agents are involved in the milling process. If at least one process control agent is used, it may not react with the metallic particles. Possible process control agents are organic solvents such as hydrocarbons (heptane, hexane, tetrahydrofurane, pentane, cyclohexane, benzene, ethers and the like). For example, a combination of hexane and stearic acid may be used as process control agents. Hexane is a solvent in which stearic acid solves and stearic acid or the like prevents the metallic particles from agglomerating.

If more than one metal is used to make the ink, each metal material may be milled separately and the milled metal particles may be mixed together after milling. Alternatively, several metal materials may be milled together in the same mill at the same time.

FIG. 2 shows a mixture of metal particles milled together. The metals in each particle 200 are in this example magnesium and aluminum. The milling process may compress the particles together so tightly that they form an alloy.

FIG. 3 shows a mixture of metal particles milled separately and mixed afterwards. The particles 300, 302 in this example are of aluminum and calcium. Irrespective of milling together or separately, more than two metals can also be mixed together.

Finally, the ink can be made by mixing the milled metallic powder with a binder and solvent in an inert atmosphere. The binder may be a material which does not react with the metallic particles. The binder may be, for example, polystyrene, polymethyl methacrylate or the like. The mixing may take place using, for example, a high shear mixer. The manufacturing may also start with metallic particles of proper size and shape and with unoxidized surface and they can directly be mixed with a binder to form ink.

After the ink is ready, a conductor may be printed. That can be performed by printing the ink on an object. The printing method may be a gravure printing, a screen printing or a flexography printing. The object may be a component or a substrate.

With reference to FIG. 4, examine a gravure printing method as an example of printing. There are many other mechanical printing methods which are suitable but it is assumed that printing methods as such are known per se and need not be explained. A rigid or flexible object 400 may run through two rolls 402, 404. The object 400 may constitute a layer in a component having a layered structure. The roll 402 may have cells 4020 to which ink 406 is transferred when the surface of the roll 402 is dipped into a pot 408 containing the ink 406. The cells can be grooves in the roll 402. A doctor blade 410 can be used to remove excess ink on the roll 402. The roll 404 may guide the object 400 and the roll 402 into a direct contact with each other for transferring the ink 406 onto a surface of the object 400. In a direct contact, the roll 402 may physically touch the object 400. The roll 404 may enforce compression between the rolls 402, 404 such that the roll 402 is pressed against the printable surface on the object 400. The layer of the component onto which the ink 406 is transferred may be the object 400 or a layer processed on the object 400 beforehand. The transfer may be carried out by running a continuous substrate through a roll-to-roll process using rotating rolls 402, 404.

The viscosity and the surface tension of the ink 406 can be controlled such that the ink droplets transferred from the separate cells 4020 join together to form a uniform layer 412 on the layer on which they are transferred. The lower the viscosity and the surface tension, the more easily the ink 406 spreads and forms a uniform layer. The ink is printed in a desired shape of the conductive pattern.

The viscosity of the ink may vary within a wide range depending on the printing method. The quality of complete layers can be controlled, for example, with the printing speed, and the angle and the force of the doctor blade with respect to the roll 402, etc. With the gravure coating method, a huge number of components can be made with the same roll and a process speed can be more than hundreds of meters per minute. One of the advantages in the transfer of ink from a rotating roll to a layer of the component is that it enables high speed fabrication in a low temperature process.

The ink on the object 400 may be hardened in an inert atmosphere or in vacuum for forming the conductor. Curing may be performed using ultraviolet or infrared radiation and/or drying can be performed at room temperature or at an elevated temperature, for example, 150° C. During hardening the solvent vaporizes away and the resulting conductor becomes hard solid.

When the ink of the conductive pattern has been hardened, the product may be transferred to another place or sold. However, the conductor has to be kept all the time in an inert atmosphere or in vacuum to avoid oxidation.

Figure 5A:
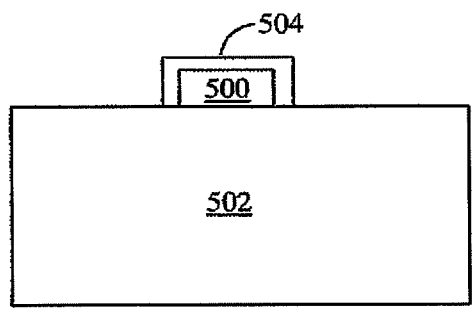
FIG. 5A shows a conductor with a protective layer.

FIG. 5A shows a front image of a conductor 500 on a component 502. The conductor 500 may be protected with a protective outer layer 504 in an inert atmosphere. The protective outer layer 504, which can be of any suitable material, prevents the conductor material from reacting with a medium different from the inert atmosphere and hence the protective outer layer 504 ensures and maintains the electrical conductivity of the conductor 500 when the component 502 is moved, for example, to normal air or to a reactive environment. A suitable material can be found, for example, experimentally.

Figure 5B:
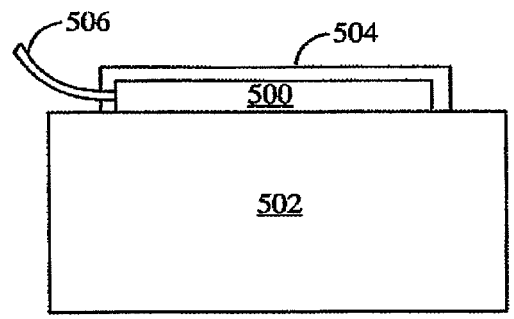
FIG. 5B shows a conductor with a protective layer with a wire.

FIG. 5B shows a side image of a conductor 500 on a component 502. Also in this Figure the conductor 500 may be protected with a protective outer layer 504 in an inert atmosphere. Additionally, a wire 506 is shown to have an electrical contact with the conductor 500 such that the wire 506 goes through the protective outer layer 504. The wire 506 may be in contact with an electrical power source (not shown in FIG. 5B).

The inert atmosphere or vacuum is continuously needed in said manipulations from milling till hardening. The inert gas may be an elemental inert gas such as a noble gas or a mixture of noble gases. The non-radioactive noble gases are helium (He), neon (Ne), argon (Ar) and/or krypton (Kr). The inert gas may also be a molecular gas such as nitrogen or a mixture of suitable molecular gases. The inert gas may also be a combination of one or more noble gases and one or more molecular gases.

Figure 6:
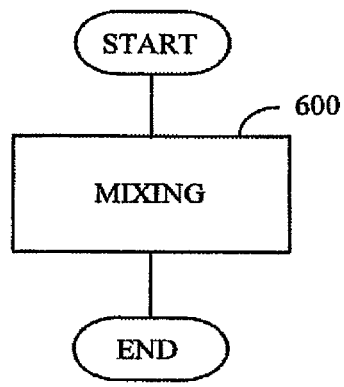
FIG. 6 shows a flow chart of a method of producing ink.

FIG. 6 presents once more the method of producing ink for forming a conductor. In step 600, unoxidized metallic particles are mixed to a binder in an inert atmosphere for forming ink, the metallic particles comprising at least one of the following: alkaline earth metal, alkali metal excluding radioactive metals and beryllium.

Figure 7:
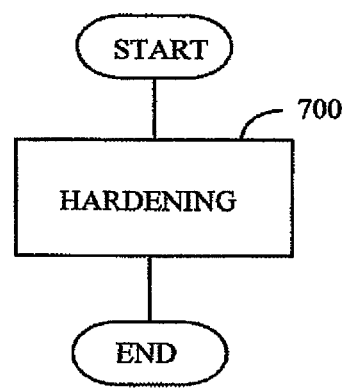
FIG. 7 shows a flow chart of a method of forming a conductor.

FIG. 7 presents once more the method of forming a conductor. In step 700, the ink is hardened on the object in an inert atmosphere or in vacuum for forming a conductor, wherein the ink has been produced by the method described in FIG. 6. The ink and the conductor are protected against oxidation up to a moment when the conductor has the protective outer layer.

Even though the invention has been described above with reference to an example according to the accompanying drawings, it is clear that the invention is not restricted thereto but can be modified in several ways within the scope of the appended claims.

What is claimed is:

1. An ink for forming a conductor, the ink comprising metallic particles and a binder, wherein the metallic particles of the ink comprise at least one member selected from the group consisting of alkaline earth metals and alkali metals, and wherein the metal particles contain no radioactive metals or beryllium,
    wherein a part of the metallic particles comprises alkaline earth metal and a part of the metallic particles comprises alkali metal;
    wherein a work function of said conductor is controlled to be less than 4 eV by an amount of said at least one member in the ink; and
    wherein the metallic particles of the ink have unoxidized electrically conductive surfaces and protective outer layers for maintaining their electrical conductivity.

2. The ink of claim 1, wherein an amount of alkaline earth metal in the ink is used to determine the work function of the conductor made of the ink.

3. The ink of claim 1, wherein an amount of alkali metal in the ink is used to determine the work function of the conductor made of the ink.

4. The ink of claim 1, wherein the metallic particles comprise magnesium.

5. The ink of claim 1, wherein metallic particles comprise calcium.

6. The ink of claim 1, wherein metallic particles comprise magnesium and calcium.

7. The ink of claim 1, wherein metallic particles comprise additionally at least one metal selected from groups 3 to 15 of the periodic table of the elements.

8. The ink of claim 7, wherein an amount of the at least one metal selected from groups 3 to 15 of the periodic table of the elements is used to adjust the work function of the conductor made of the ink.

* * * * *